(12) United States Patent
Persson

(10) Patent No.: US 6,246,286 B1
(45) Date of Patent: Jun. 12, 2001

(54) ADAPTIVE LINEARIZATION OF POWER AMPLIFIERS

(75) Inventor: Jonas Persson, Lund (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/427,773

(22) Filed: Oct. 26, 1999

(51) Int. Cl.[7] .................................................. H03F 1/26

(52) U.S. Cl. ...................... 330/149; 330/136; 375/296; 455/126

(58) Field of Search .................................. 330/149, 136; 375/296, 297; 455/126, 127

(56) References Cited

U.S. PATENT DOCUMENTS

| | | | |
|---|---|---|---|
| 4,485,349 | * 11/1984 | Siegel et al. | 330/3 |
| 4,999,583 | * 3/1991 | Washburn et al. | 330/86 |
| 5,049,832 | * 9/1991 | Cavers | 330/149 |
| 5,381,108 | * 1/1995 | Whitmarsh et al. | 330/2 |
| 5,732,334 | * 3/1998 | Miyake | 455/126 |
| 5,748,037 | 5/1998 | Rozental et al. | 330/2 |
| 5,748,038 | 5/1998 | Boscovic et al. | 330/2 |
| 5,760,646 | * 6/1998 | Belcher et al. | 330/149 |
| 5,850,162 | * 12/1998 | Danielsons | 330/149 |
| 5,870,668 | * 2/1999 | Takano et al. | 455/126 |
| 5,892,397 | 4/1999 | Belcher et al. | 330/149 |
| 5,898,338 | * 4/1999 | Proctor et al. | 330/149 |
| 5,903,611 | 5/1999 | Schnabl et al. | 375/297 |
| 6,081,698 | * 7/2000 | Moriyama et al. | 455/126 |
| 6,091,941 | * 7/2000 | Moriyama et al. | 455/126 |

FOREIGN PATENT DOCUMENTS

| | | |
|---|---|---|
| 0 513 402 A1 | 11/1992 | (EP) . |
| 0 638 994 A1 | 2/1995 | (EP) . |
| 0 658 975 A1 | 6/1995 | (EP) . |

OTHER PUBLICATIONS

T. Matsuoka, M. Orihashi, M. Sagawa, H. Ikeda, and K. Misaizu, "Compensation of Nonlinear Distortion During Transmission Based on the Adaptive Predistortion Method," *IEICE Trans. Electron.*, vol. E80–C, No. 6, Jun., 1997, pp. 782–787.

T. Rahkonen and T. Kankaala, "An Analog Predistortion Integrated Circuit for Linearizing Power Amplifiers", 1998 Midwest Symposium on Systems and Circuits, South Bend, Indiana, Aug. 9–12, 1998, pp. 1–4.

W. H. Pierce, P. Aronhime, and J. Deng, "A Simple Predistortion Algorithm and Limits of Predistortion", 1998 Midwest Symposium on Systems and Circuits, South Bend, Indiana, Aug. 9–12, 1998, pp. 1–4.

R. S. Narayanaswami, The Design Of A 1.9GHz 250mW CMOS Power Amplifier For DECT., http://kabuki.eecs.berkeley.edu/~rsn/Theses/MS/master.full.html; printed May 16, 1999, pp. 1–42.

S. Andreoli, H. McClure, P. Banelli, S. Cacopardi, "Linearizing Digital RF Amplifier", IEEE—46th Broadcast Symposium, http://www.itelco-usa.com/ieee/Intro.htm; printed May 10, 1999, pp. 1–12.

Standard Search Report for RS 104147US Completed Apr. 4, 2000.

\* cited by examiner

*Primary Examiner*—Robert Pascal
*Assistant Examiner*—Henry Choe
(74) *Attorney, Agent, or Firm*—Jenkens & Gilchrist, PC

(57) ABSTRACT

A method and apparatus adaptively compensates for non-linearities of a power amplifier by measuring a distortion characteristic across the power amplifier during amplification of a distortion detection signal. The distortion detection signal has a well-defined input power versus time relationship, such as ramp-up signal or ramp-down signal. Due to this well-defined relationship, the distortion characteristic can be calculated as a function of the input power level. This calculated function is then utilized to update a predistortion lookup table.

33 Claims, 10 Drawing Sheets

ADAPTIVE LINEARIZATION OF POWER AMPLIFIERS

BACKGROUND OF THE INVENTION

1. Technical Field of the Invention

The present invention relates in general to the field of communication systems, and in particular, to adaptive linearization of power amplifiers in such communication systems.

2. Description of Related Art

In order to keep pace with the ever increasing demand for higher capacity wireless and personal communication services, modern digital communication systems have become increasingly reliant upon spectrally efficient linear modulation schemes, such as Quadrature Phase Shift Keying (QPSK), Quadrature Amplitude Modulation (QAM), and recently 3π/8-8PSK used in the Enhanced Data Rates for GSM Evolution (EDGE) system. Unlike conventional digital modulation techniques which utilize a constant envelope, linear modulation schemes exploit the fact that digital baseband data may be modulated by varying both the envelope (e.g., amplitude) and phase of an RF carrier. Because the envelope and phase offer two degrees of freedom, digital baseband data may be mapped into four more possible RF carrier signals, enabling the transmission of more information within the same channel bandwidth than if just the envelope or phase were varied alone. As a result, linear modulation schemes provide significant gains in spectrum utilization, and have become an attractive alternative to conventional digital modulation techniques.

The variation of both the envelope and phase of the RF carrier, however, causes linear modulation schemes to be highly susceptible to the inherent nonlinear distortion associated with power amplifiers. Although conventional digital modulation techniques are less susceptible to such distortion due the use of a constant envelope, the non-constant envelope utilized by linear modulation schemes causes the gain and phase-shift of the power amplifier to vary as a function of the input signal. This non-constant gain and phase-shift, in turn, causes two types of nonlinear distortion. The first type of nonlinear distortion, known as AM/AM distortion, occurs when the input power and the output power depart from a linear relationship. The second type, known as AM/PM distortion, occurs when the phase-shift of the power amplifier varies as a function of the input power level.

If the power amplifier used to amplify linearly modulated signals fails to compensate for both types of nonlinear distortion, the power amplifier will generate unwanted intermodulation products and cause an accompanying degradation in the quality of the communications. When intermodulation products occur outside the channel bandwidth, for example, an effect known as spectral regrowth or widening causes increased interference with communications in adjacent channels. Furthermore, intermodulation products occurring within the channel bandwidth may distort the modulated signal to such an extent that it cannot be properly reconstructed or detected at the receiver, resulting in increased bit error rates. Therefore, in order to prevent unwanted intermodulation products and avoid the accompanying degradation in the quality of communications, linear modulation schemes require a linear power amplifier with a constant gain and phase-shift for all operating power levels.

Unfortunately, because power amplifiers are inherently nonlinear devices, the gain and phase-shift of power amplifiers vary in a complex, nonlinear manner depending on such variables as component aging, component variation, channel switching, power supply variation, component drift, temperature fluctuations, and the input signal itself. Existing approaches, such as continuous feedback, feedforward networks and conventional predistortion techniques, have attempted to compensate for these nonlinear characteristics by utilizing some form of continuous feedback loop or fixed pre-processing or post-processing network. These approaches, however, either fail to adaptively compensate for time-varying fluctuations in nonlinear characteristics or prove difficult to implement at RF frequencies. For example, continuous feedback approaches, such as negative feedback or Cartesian feedback, typically require a high loop bandwidth and could cause stability problems when operated at high frequencies. Feedforward networks, on the other hand, cannot adaptively compensate for variations in distortion characteristics due to the fixed nature of the feedforward network, and require precise matching and scaling of components in order to avoid inadvertently introducing additional nonlinear distortion. Conventional predistortion techniques similarly fail to adaptively compensate for variations in nonlinear characteristics due to the use of a fixed set of predistortion coefficients.

One existing approach that adaptively compensates for variations in nonlinear distortion is an approach known as adaptive predistortion. In contrast to the conventional predistortion technique mentioned earlier, traditional adaptive predistortion periodically senses the output of the power amplifier and updates the predistortion coefficients for time-varying nonlinearities in the forward path. These updated predistortion coefficients are then used to predistort the input signal in such a manner that a linear amplified signal is produced at the output of the power amplifier.

Although traditional adaptive predistortion provides adequate linearization of a power amplifier, the traditional adaptive predistortion technique places significant processing demands on the digital signal processor used to implement this technique. Typically, the look-up table that stores the predistortion coefficients must be updated several times per symbol (e.g., five times per symbol) depending on the oversampling rate. Moreover, a typical "burst" in a Time Division Multiple Access (TDMA) system may include as many as 100–200 symbols. As a result, this example would require the digital signal processor to update the lookup table 500–1000 times per burst. This places a significant burden on the precessing requirements (and corresponding cost) of the digital signal processor and increases current consumption.

A further disadvantage of the traditional adaptive predistortion technique is that it requires a quadrature demodulator in the feedback loop. This quadrature demodulator is required in order to enable the digital signal processor to compare the data stream detected at the output of the power amplifier with the input data stream. In addition to the increased costs and current consumption, the quadrature demodulator can also introduce errors which will be reflected in the updated predistortion coefficients and will adversely affect the ability to compensate for nonlinear distortion in the power amplifier. Therefore, in view of the deficiencies of existing approaches, there is a need for an adaptive linearization technique that can effectively compensate for time-varying nonlinearities of the power amplifier and at the same time relax the processing requirements of the digital signal processor and decrease current consumption.

SUMMARY OF THE INVENTION

The deficiencies of the prior art are overcome by the method and apparatus of the present invention. For example, as heretofore unrecognized, it would be beneficial to measure distortion characteristic(s) across a power amplifier during amplification of a distortion detection signal. This distortion detection signal comprises, for example, a ramp-up signal or ramp-down signal. Preferably, however, the distortion detection signal comprises a burst up-ramp or burst down-ramp signal commonly used before or after a communication burst in a Time Division Multiple Access (TDMA) system. Using a burst up-ramp or burst down-ramp signal offers the added advantage of allowing the principles of the present invention to be easily incorporated into existing TDMA communication systems.

Based on the measured distortion characteristic(s) and known characteristics of the distortion detection signal, a relationship between the measured distortion characteristic(s) and input power is calculated. A predistortion lookup table is updated in accordance with this calculated relationship, and may then be applied to an input data stream to produce a linear amplified output when the predistorted input is amplified by the power amplifier.

In a first embodiment of the present invention, phase distortion across the power amplifier is measured during amplification of the distortion detection signal. This measurement may be performed, for example, by comparing the phase of the input and the phase of the output over the operating power range of the distortion detection signal. A relationship between the measured phase distortion and input power is calculated based on the measured phase distortion and known characteristics of the distortion detection signal. A predistortion lookup table is updated in accordance with this calculated relationship, and may then be applied to an input data stream to adaptively compensate for non-constant phaseshift in the power amplifier.

In a second embodiment, the envelope (amplitude) distortion across the power amplifier is measured during the amplification of the distortion detection signal. This measurement may be performed, for example, by comparing the amplitude of the input and the amplitude of the output over the operating power range of the distortion detection signal. A relationship between the measured envelope distortion and input power is calculated based on the measured envelope distortion and known characteristics of the distortion detection signal. A predistortion lookup table is updated in accordance with this calculated relationship, and may then be applied to an input data stream to adaptively compensate for nonlinear gain in the power amplifier.

In a third embodiment, both envelope (amplitude) and phase distortion are measured during amplification of the distortion detection signal. Based on the measured envelope and phase distortion and known characteristics of the distortion detection signal, relationships between the input power and the measured envelope and phase distortion are calculated. A predistortion lookup table is updated in accordance with these calculated relationships, and may then be applied to an input data stream to adaptively compensate for both nonlinear gain and non-constant phase-shift in the power amplifier.

In one aspect of the present invention, the predistortion lookup table is updated only once per communication burst in order to relax the processing demands on and power consumption of a digital signal processor. In another aspect, detectors used to measure the distortion characteristics are configured in pairs with similar input signal levels in order to reduce the impact of non-ideal detection components. In yet another aspect, mixers are utilized to down-convert the input and output signals of the power amplifier from RF frequencies to an intermediate frequency to allow the detection components to operate at a lower frequency.

The technical advantages of the present invention include, but are not limited to the following. It should be understood that particular embodiments may not involve any, much less all, of the following exemplary technical advantages.

An important technical advantage of the present invention is the ability to adaptively compensate for time-varying nonlinearities of a power amplifier.

Another important technical advantage of the present invention is that it improves the power efficiency of the power amplifier because the linearity requirements on the power amplifier itself are relaxed.

Yet another important technical advantage of the present invention is that it enables the phase and gain distortion characteristics of the power amplifier to be measured only for those input power levels that will be used when the modulated signal is amplified.

Yet another important technical advantage of the present invention is that it relaxes the processing requirements of the digital signal processor by requiring the predistortion lookup table to be updated only once per communication burst.

Yet another important technical advantage of the present invention is that is reduces current consumption of the digital signal processor since it is only used for a small fraction of the communication burst.

Yet still another important technical advantage of the present invention is that the "balanced" configuration of the distortion detectors reduces the impact of non-ideal detection components.

The above-described and other features of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

In the following description, for purposes of explanation and not limitation, specific details are set forth, such as particular circuits, logic modules (implemented in, for example, software, hardware, firmware, some combination thereof, etc.), techniques, etc. in order to provide a thorough understanding of the invention. However, it will be apparent to one of ordinary skill in the art that the present invention may be practiced in other embodiments that depart from these specific details. In other instances, detailed descriptions of well-known methods, devices, logical code (e.g., hardware, software, firmware, etc.), etc. are omitted so as not to obscure the description of the present invention with unnecessary detail.

Figure 1:
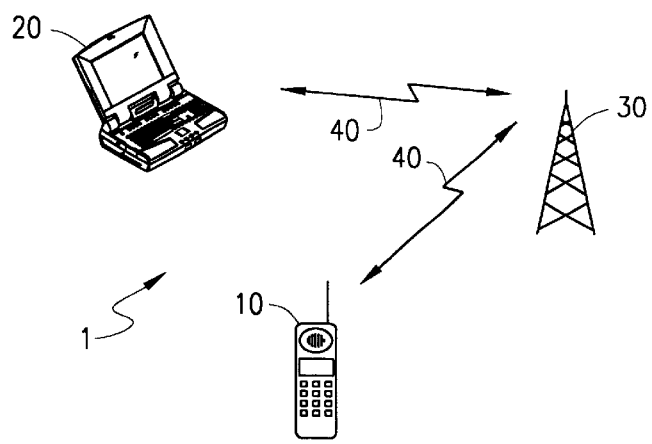
FIG. 1 illustrates a portion of an exemplary wireless system with which the present invention may be advantageously practiced.

A preferred embodiment of the present invention and its advantages are best understood by referring to FIGS. 1–12 of the drawings, like numerals being used for like and corresponding parts of the various drawings. Referring to FIG. 1, a portion of an exemplary wireless system with which the present invention may be advantageously practiced is depicted generally at 1. In this exemplary wireless system, a mobile station 10 communicates with a base station 30 over an air interface 40. A data terminal 20, such as a personal computer, may also communicate with the base station 30 over the same air interface 40 using, for example, a cellular modem. Because the base station 30 is a part of a cellular network (not shown), the base station 30 enables the mobile station 10 and data terminal 20 to communicate with one another and with other terminals within the telecommunication system.

In order for the mobile station 10, base station 30, and the data terminal 20 to communicate digital information, however, transmitters associated with each device must modulate the digital information utilizing some form of digital modulation technique. The digital modulation technique employed may include conventional techniques, such as Phase Shift Keying (PSK) or Amplitude Modulation (AM), or more spectrally efficient techniques, such as Quadrature Phase Shift Keying (QPSK), Quadrature Amplitude Modulation (QAM), and recently $3\pi/8$-8PSK used in the Enhanced Data Rates for GSM Evolution (EDGE) system. Each of these techniques imposes certain requirements on the power amplifier within the transmitter in order to prevent distortion of the modulated signal. Depending on the type of modulation technique employed, these requirements may include a constant gain, a constant phase-shift or both a constant gain and a constant phase shift.

Figure 2:
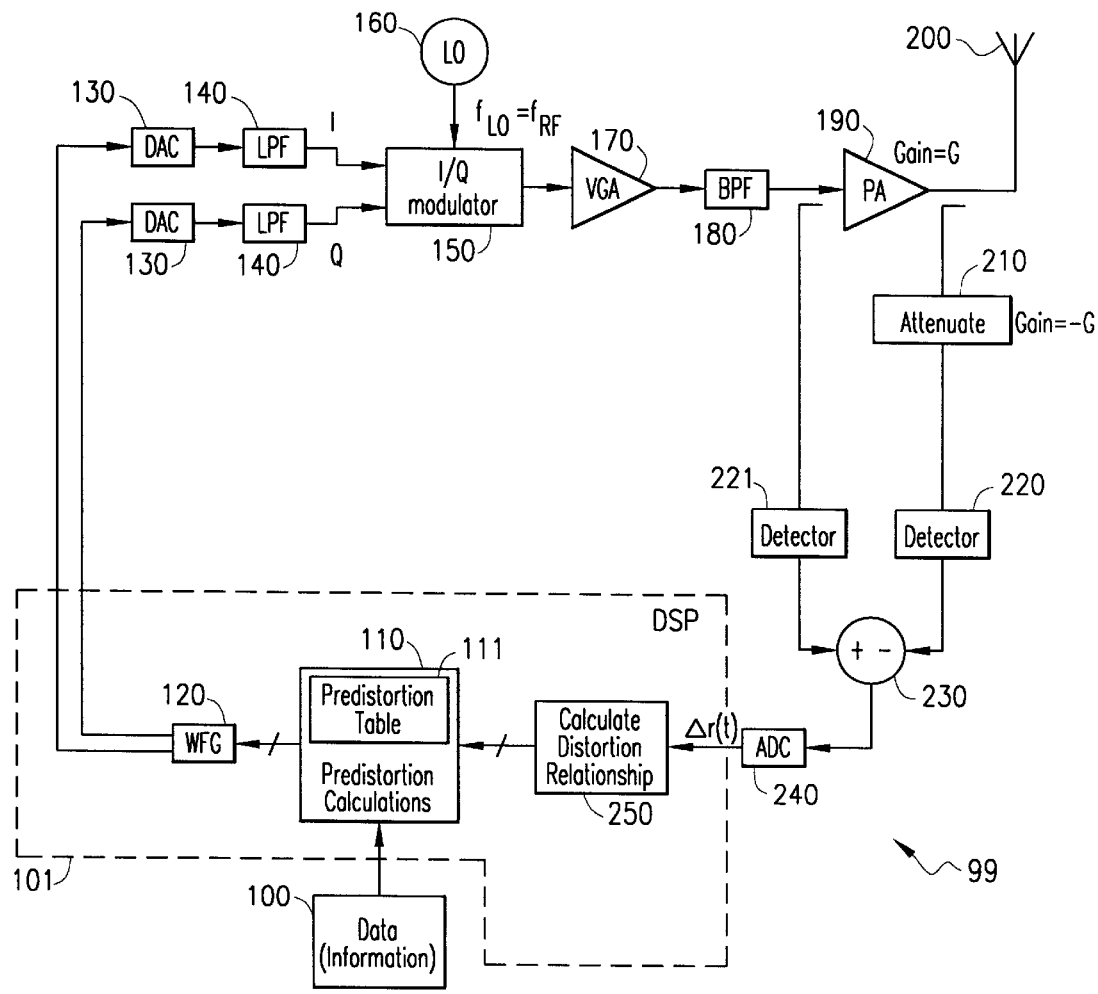
FIG. 2 illustrates an exemplary schematic block diagram of a transmitter in accordance with the present invention.

The flexible approach offered by the various embodiments of the present invention enables each of these requirements to be either collectively or independently satisfied in an efficient and cost effective manner. Referring to FIG. 2, an exemplary schematic block diagram of a transmitter in accordance with the present invention is illustrated. It should be emphasized that although the transmitter illustrated in FIG. 2 utilizes a quadrature modulator, the present invention is not limited to quadrature modulation techniques. Rather, the principles of the present invention are equally applicable to other digital modulation techniques where nonlinear distortion is a concern, such as PSK and AM. Therefore, the following discussion is provided by way of explanation, and not limitation.

Beginning with the forward transmission path of the transmitter depicted generally at 99, digital information 100 is applied to a predistortion block 110. This predistortion block 110 contains predistortion calculations and predistortion coefficients which are used to predistort the digital information 100 in such a manner that a linear amplified signal is produced at the output of the power amplifier 190. The predistortion coefficients are stored in, for example, a predistortion lookup table 111 within the predistortion block 110 and are periodically updated to compensate for time-varying nonlinearities of the power amplifier 190. The manner by which the predistortion coefficients are periodically updated will be described in further detail below.

Figure 3:
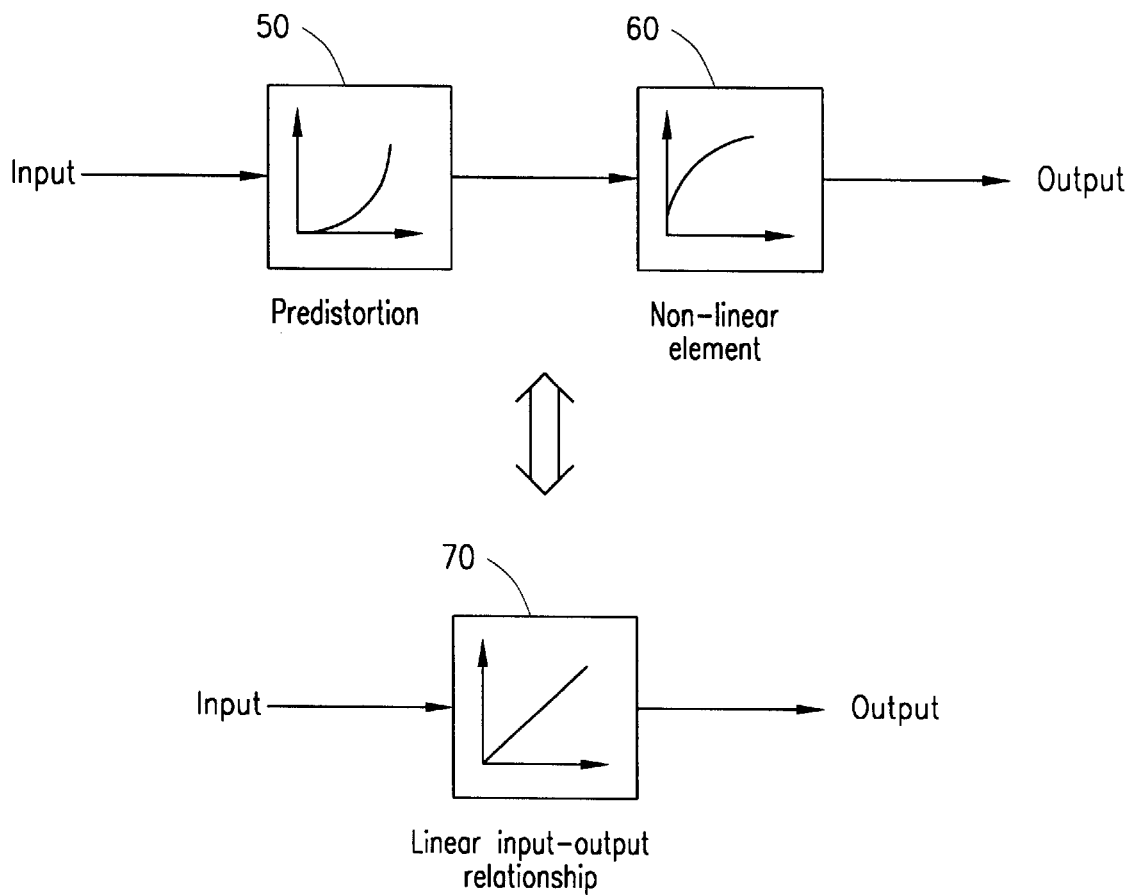
FIG. 3 illustrates operating principles of an exemplary predistortion technique practiced by one aspect of the present invention.

Referring for the moment to FIG. 3, operating principles of an exemplary predistortion technique practiced by one aspect of the present invention is illustrated. As shown, the forward transmission path of a transmitter 99 includes a non-linear element 60, such as a power amplifier 190, and a predistortion element, such as a predistortion block 110. If the input signal is perfectly predistorted at the predistortion element 50 by the inverse non-linear characteristic(s) of the non-linear element 60, then a linear input-output relationship results as depicted at 70. Thus, one aspect of the present invention measures the non-linear distortion characteristic(s) of the power amplifier 190 and predistorts the digital information 100 at the predistortion block 110 by the inverse distortion characteristic(s) to produce a linear input-output relationship.

Continuing with the forward path of the transmitter 99 depicted in FIG. 2, the output of the predistortion block 110 is applied to a wave form generator (WFG) 120 which generates separate in-phase (I) and quadrature (Q) signals. Each digital I and Q signal is then passed through a digital-to-analog converter (DAC) 130 and a low pass filter (LPF) 140 to convert the digital I and Q signals to analog signals. The analog I and Q signals are then combined in an linear modulator, such as an I/Q modulator 150, and up-converted to RF frequencies via a local oscillator 160. The output of the I/Q modulator 150 is then amplified by a variable gain amplifier (VGA) 170 and filtered by a band pass filter (BPF) 180 in order to attenuate out-of-band power. In the final stage, the output of the band pass filter 180 is amplified by a power amplifier (PA) 190 and transmitted via antenna 200.

In the feedback path, an embodiment of the present invention measures distortion characteristic(s) across the power amplifier 190, such as a nonlinear phase-shift or non-linear gain, by monitoring the input and output of the power amplifier 190 during the amplification of a distortion detection signal. This distortion detection signal preferably has a well defined time-variant relationship over the operating power range of the power amplifier 190, enabling the measured distortion characteristics to be easily converted to a function of the input power level. Examples of a preferred distortion detection signal include an up-ramp signal or down-ramp signal. Preferably, however, the distortion detection signal comprises the burst ramp-up signal or burst ramp-down signal commonly used in TDMA systems before or after transmission of a communication burst. Utilizing the burst ramp-up or burst ramp-down signals has the added advantage of allowing the preferred embodiment of the present invention to be easily implemented within existing TDMA systems.

Figure 4:
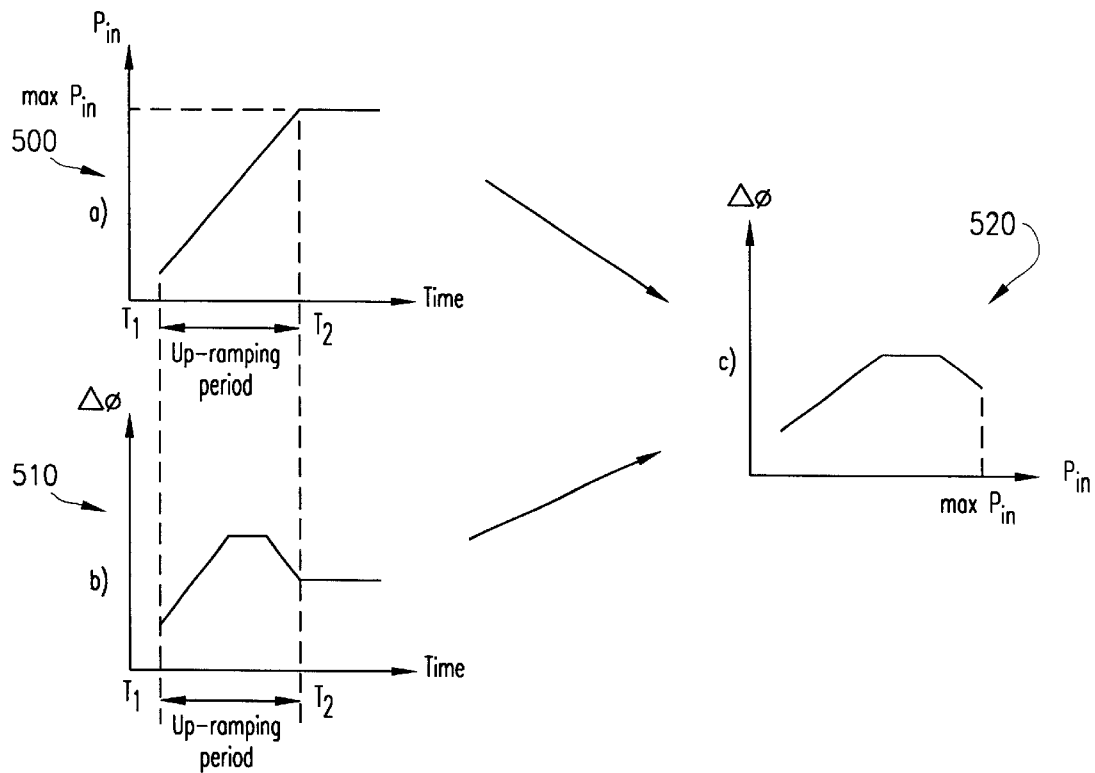
FIGS. 4(a)–4(c) illustrate an exemplary conversion of a measured phase distortion characteristic to a function of the input power level in accordance with the present invention.

Before describing the feedback path illustrated in FIG. 2, an exemplary process by which the preferred embodiment of the present invention converts the measured distortion characteristic to a function of the input power will be described. Referring to FIG. 4, an exemplary conversion of a measured phase distortion characteristic to a function of the input power level in accordance with the present invention is illustrated. In this example, the distortion detection signal applied to the power amplifier 190 comprises an up-ramp signal which has an input power versus time relationship as depicted generally at 500. If the phase difference ($\Delta\phi$) across the power amplifier 190 is measured during the same time period (T1–T2) that the distortion detection signal is applied, the phase difference versus time relationship may have a measured phase distortion characteristic as depicted generally at 510. From the two relationships 500 and 510, the relationship between the phase difference and the input power can be calculated as depicted generally at 520. This calculated relationship is then used to update the predistortion coefficients in the predistortion block 110 to compensate for phase distortion of the power amplifier 190. It should be emphasized that although FIG. 4 illustrates the conversion of phase distortion characteristics using an up-ramp signal, the principles of the present invention are equally applicable for a down-ramp signal or other distortion detection signals, especially those having a well-defined or "known" power versus time relationship.

Figure 5:
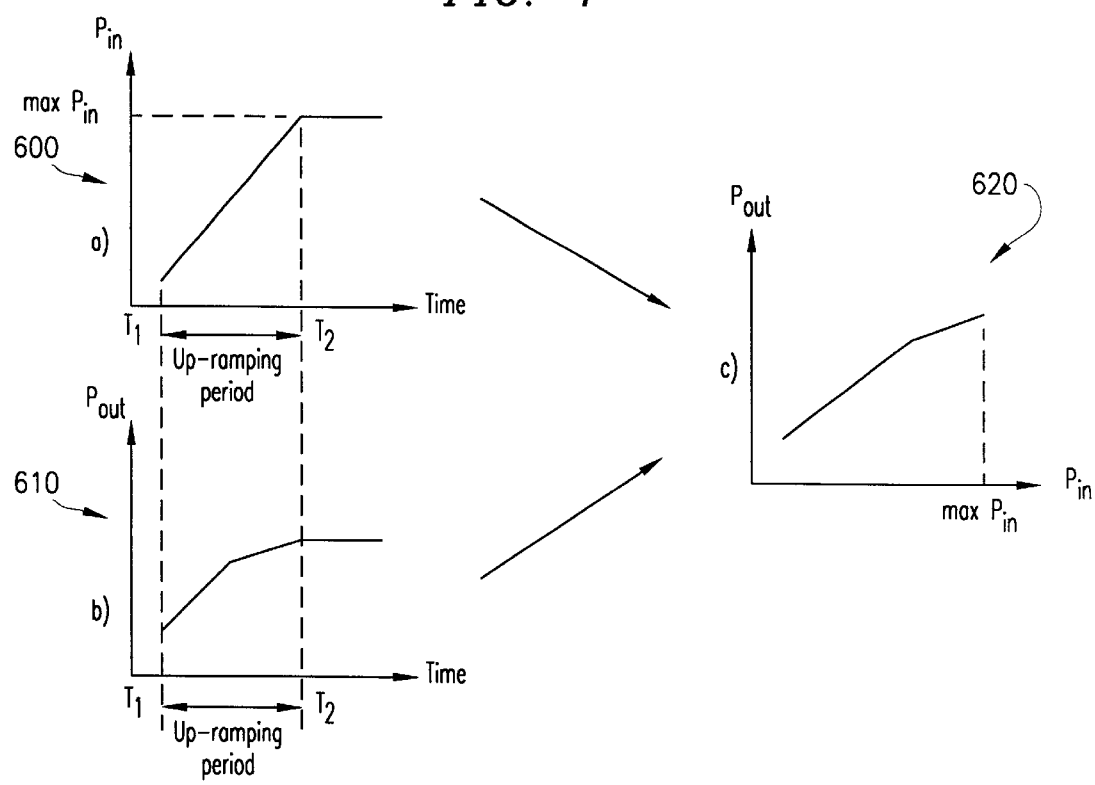
FIGS. 5(a)–5(c) illustrate an exemplary conversion of a measured amplitude (envelope) distortion characteristic to a function of the input power level in accordance with the present invention.

Similarly, FIG. 5 illustrates an exemplary conversion of a measured envelope (amplitude) distortion characteristic to a function of the input power level in accordance with the present invention. In this example, the distortion detection signal applied to the power amplifier 190 also comprises an up-ramp signal and has an input power versus time relationship as depicted generally at 600. If the output power ($P_{out}$) of the power amplifier 190 is measured during the same time period (T1–T2) that the distortion detection signal is applied, the output power versus time relationship may have a measured envelope (amplitude) distortion characteristic as depicted generally at 610. From the two relationships 600 and 610, the relationship between the output power and the input power can be calculated as depicted generally at 620. This calculated relationship is then used to update the predistortion coefficients in the predistortion block 110 to compensate for amplitude distortion of the power amplifier 190. Again, it should be emphasized that although FIG. 5 illustrates the conversion of envelope distortion characteristics using an up-ramp signal, the principles are equally applicable for a down-ramp signal or other distortion detection signals, especially those having a well-defined or "known" input power versus time relationship.

Because a relationship between distortion characteristics and input power is calculated for all possible input power levels, one advantageous aspect of the preferred embodiment of the present invention updates the predistortion coefficients only once per communication burst. This aspect of the preferred embodiment relaxes the processing requirements of the digital signal processor depicted generally at 101 (along with other associated functional or memory elements) or other device which updates the predistortion lookup table 111. Current consumption is also reduced because only a small part of the communication burst is needed to calculate the predistortion. Furthermore, if a burst up-ramp signal is used as the distortion detection signal, the updated predistortion coefficients can be applied on the same communication burst, assuming the predistortion lookup table 111 can be updated fast enough. Alternatively, if the power amplifier 190 characteristics do not vary much between bursts, the distortion characteristics can be measured at one burst and applied at a later or subsequent burst. Another alternative is to determine the distortion characteristics based on measurements from several distortion detection signals (e.g, and determine some kind of mean). Finally, in another aspect of the embodiment of FIG. 2, the distortion characteristics of the power amplifier 190 are only measured over the dynamic range that is used in the modulated signal. For example, only a part of the distortion detection signal may be needed. Consequently, the distortion characteristics of the power amplifier 190 only have to be measured for those input power levels that will be used when the power amplifier is modulated.

Referring again to FIG. 2, a distortion characteristic across the power amplifier 190 is measured by feeding a portion of the output signal and a portion of the input signal to two corresponding detectors 220, 221 after and before, respectively, amplification of the distortion detection signal. Preferably, before the output signal is measured by its corresponding detector 220, an attenuation mechanism 210 attenuates the output signal by a factor approximating the nominal gain G of the power amplifier 190. Attenuating the output signal causes the input signals of the two detectors 220, 221 to have roughly the same amplitude, which helps cancel distortion caused by the detectors 220, 221. Furthermore, although a different type of detector configuration can be used to measure the signal characteristics of the output and input, the pair of distortion detectors 220, 221 utilized by the embodiment of FIG. 2 creates a "balanced" configuration which reduces the impact of non-ideal detection components. The pair of detectors 220, 221 measure at least one signal characteristic of the output and input, such as the amplitude, phase or both amplitude and phase, and pass their output to an error detector 230. The error detector 230 compares the measured signal characteristic corresponding to the input signal and output signal, and generates an error signal corresponding to the amount of nonlinear distortion. After the error signal is converted to the digital domain using an analog-to-digital converter (ADC) 240, a distortion detection block 250 accumulates the error signals during the amplification of the distortion detection signal and calculates a relationship between the measured distortion characteristic and input power as described above. This relationship is then used to update the predistortion coefficients in the predistortion block 110, enabling the predistortion block 110 to compensate for nonlinearities of the power amplifier 190.

Figure 6:
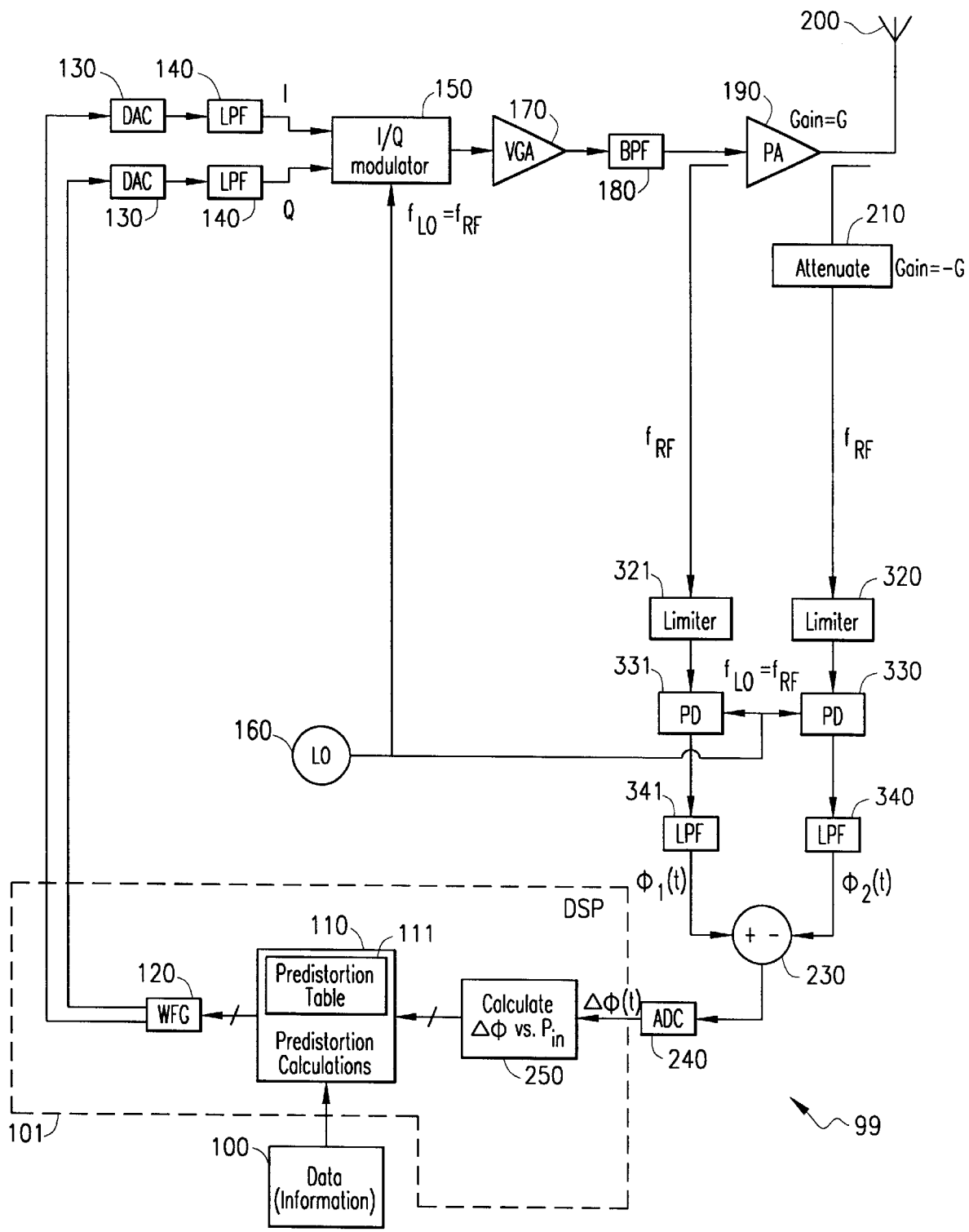
FIG. 6 illustrates an exemplary schematic block diagram of a transmitter in accordance with a first embodiment of the present invention.

FIG. 6 illustrates an exemplary schematic block diagram of a transmitter in accordance with a first embodiment of the present invention. The first embodiment of the present invention utilizes the same forward transmission path as the embodiment of FIG. 2 described above, but compensates for a non-constant phase-shift in the power amplifier 190 using different detectors in the feedback path. In the first embodiment, a part of the output signal and a part of the input signal are limited in two separate limiters 320, 321 after and before, respectively, amplification of the distortion detection signal. Preferably, before the output signal is limited, the output signal is attenuated by a factor approximating the nominal gain G of the power amplifier 190. Attenuating the output signal allows that the input signals to the two limiters 320, 321 to have roughly the same amplitude, which helps cancel AM/PM distortion caused by the limiters 320, 321. Two phase-detectors 330, 331 detect the phase of the output and the phase of the input of the power amplifier 190. The local oscillator 160 used to up-convert the original input signal serves as a reference frequency to the two phase detectors 330, 331. The outputs of the phase detectors 330, 331 are filtered by low-pass filters 340, 341 to suppress high frequencies, such as harmonic frequencies of the local oscillator 160. A measurement of the phase-shift through the power amplifier is detected by an error detector 230 and is sent to an analog-to-digital converter 240. In the digital domain, the relationship between the input power level and the phase-shift is calculated in the distortion detection block 250 using the principles described above with respect to the embodiment of FIG. 2. This relationship is then used to update the predistortion lookup table 111 contained within the predistortion block 110, enabling the predistortion block 110 to adaptively compensate for non-constant phase shift across the power amplifier 190.

Figure 7:
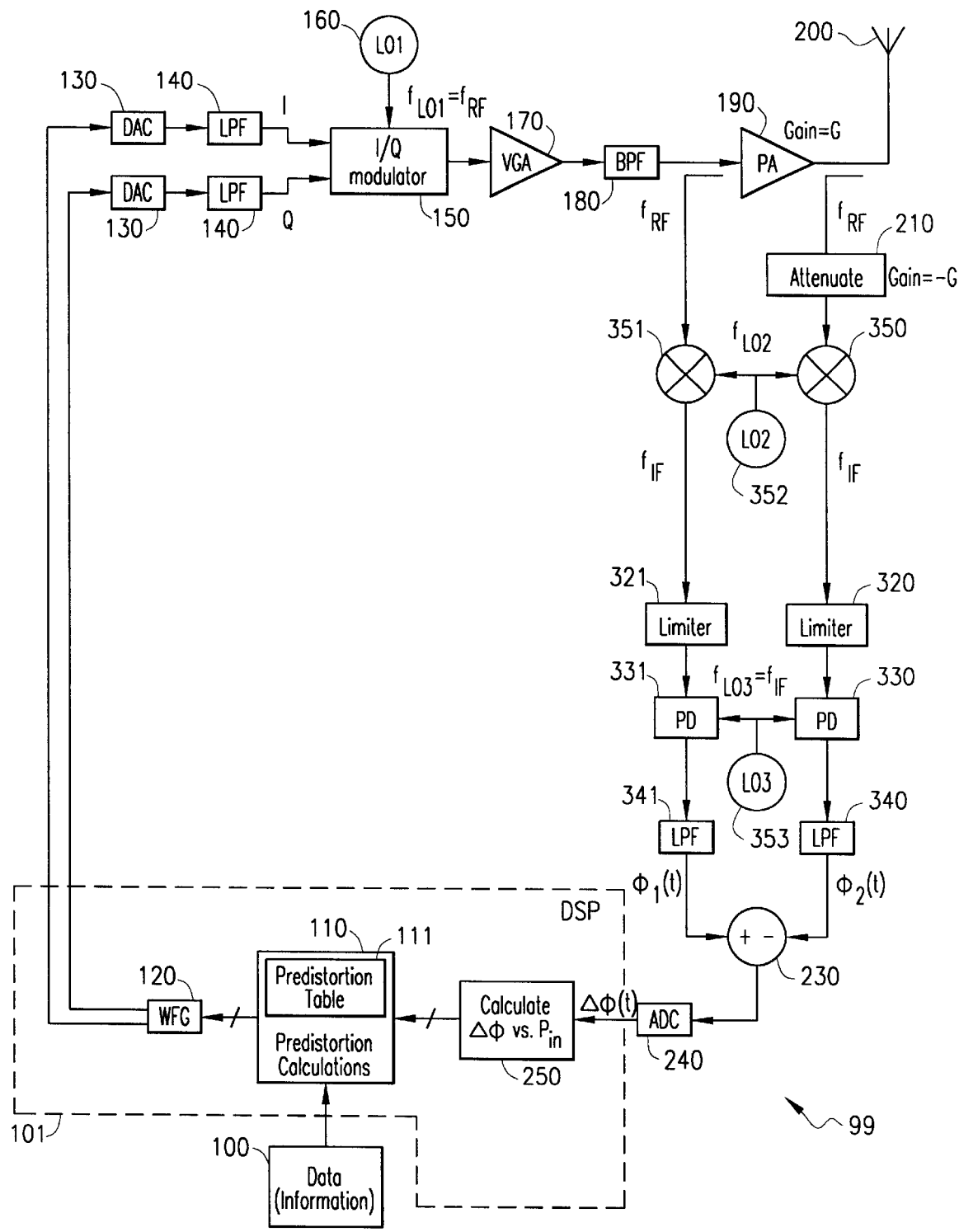
FIG. 7 illustrates an exemplary schematic block diagram of the transmitter in accordance with the first embodiment of the present invention implementing mixers to down-convert the RF input and output signals to an intermediate frequency.

Optionally, in order to relax the requirements on the components in the feedback path of the first embodiment, the first embodiment may be modified to down-convert the RF input and output signals of the power amplifier 190. FIG. 7 illustrates an exemplary schematic block diagram of the transmitter in accordance with the first embodiment of the present invention implementing mixers to down-convert the RF input and output signals to an intermediate frequency. As illustrated, two mixers 350, 351 are placed between the power amplifier 190 and the two limiters 320, 321. A first local oscillator 352 enables the mixers 350, 351 to down-convert the output and input signals of the power amplifier 190 from RF frequencies to a lower intermediate frequency. A second local oscillator 353 serves as the reference frequency for the phase detectors 330, 331. Although two additional mixers 350, 351 and two additional local oscillators 352, 353 are required, the advantage of this approach is that components in the feedback path may operate at a lower frequency.

Figure 8:
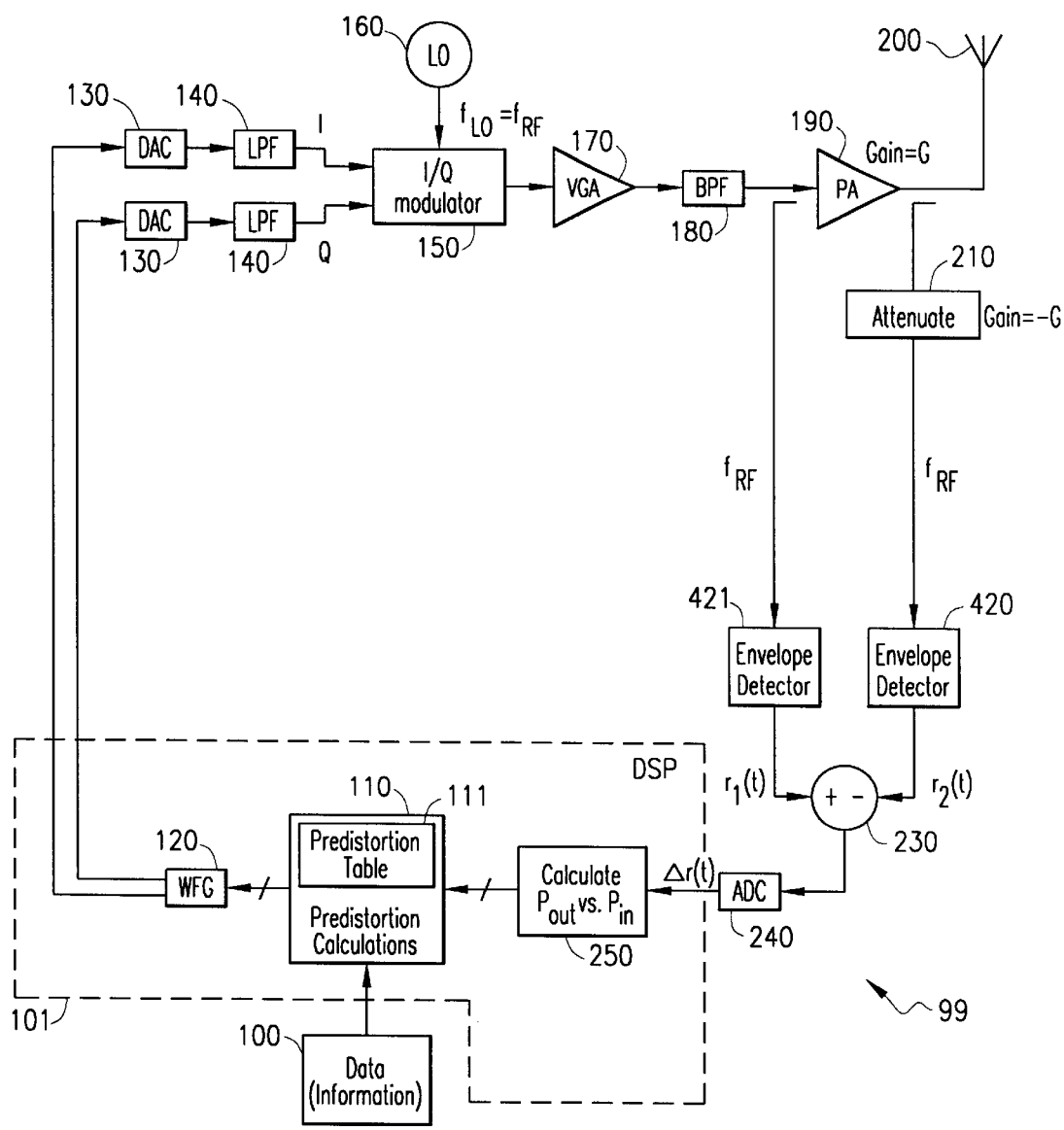
FIG. 8 illustrates an exemplary schematic block diagram of a transmitter in accordance with a second embodiment of the present invention.

FIG. 8 illustrates an exemplary schematic block diagram of a transmitter in accordance with a second embodiment of the present invention. The second embodiment utilizes the same forward transmission path as described in the embodiment of FIG. 2, but compensates for amplitude distortion in the power amplifier 190 using different detectors in the feedback path. In the second embodiment, a part of the output signal and a part of the input signal of the power amplifier 190 are applied to two separate envelope detectors 420, 421 after and before, respectively, amplification of the distortion detection signal. Preferably, before the envelope of the output signal is detected, the output of the power amplifier 190 is attenuated by a factor approximating the nominal gain G of the power amplifier 190, enabling the inputs to the two envelope detectors 420, 421 to have roughly the same amplitude level. A measurement of the amplitude difference between the output of the power amplifier 190 and input of the power amplifier 190 is detected by an error detector 230 and sent to an analog-to-digital converter 240. In the digital domain, the relationship between the envelope distortion and the input power is calculated using the principles described above with respect to the embodiment of FIG. 2. This relationship is then used to update the predistortion lookup table 111 contained within the predistortion block 110, enabling the predistortion block 110 to adaptively compensate for non-constant gain of the power amplifier 190.

Figure 9:
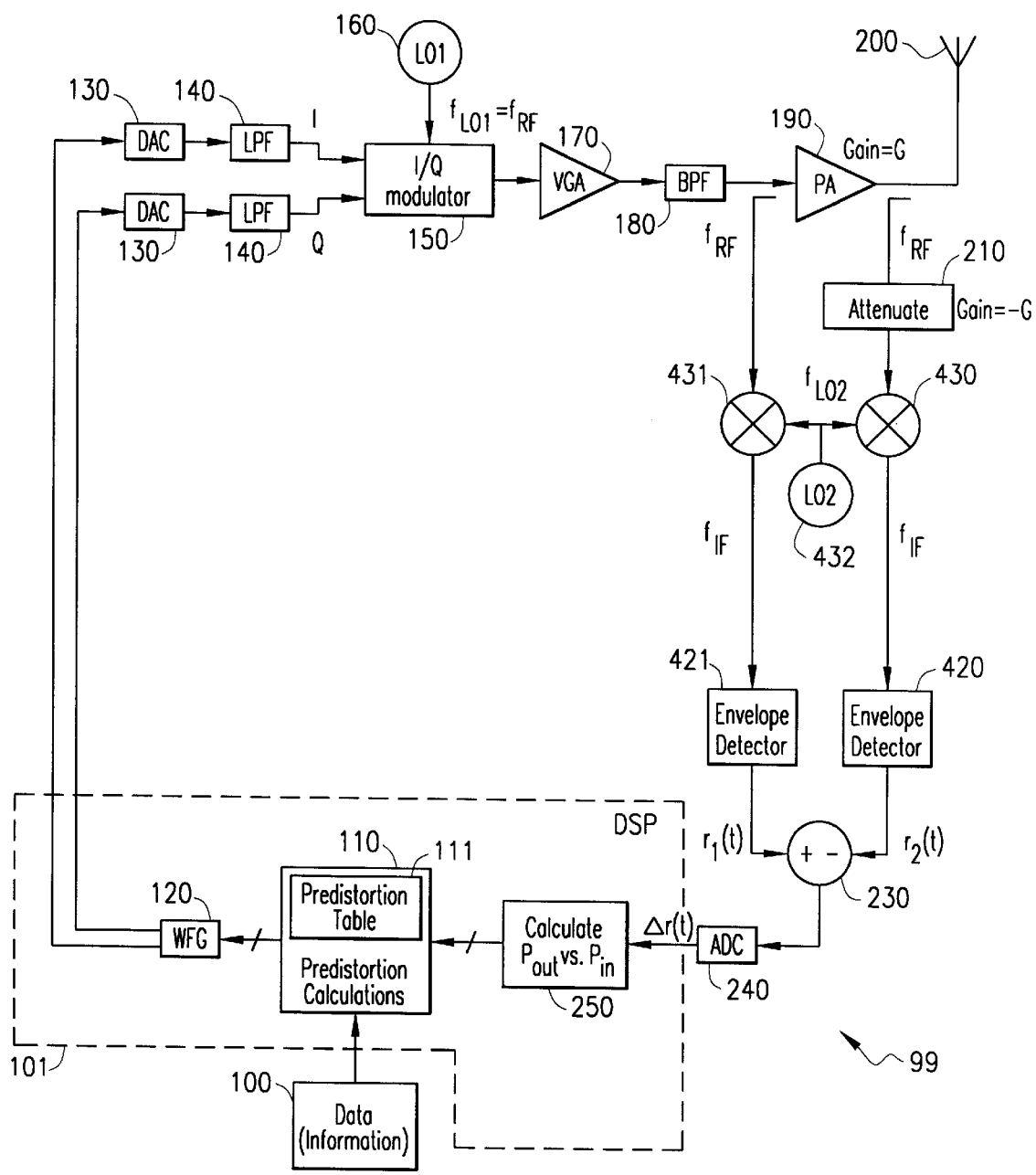
FIG. 9 illustrates an exemplary schematic block diagram of the transmitter in accordance the second embodiment of the present invention implementing mixers to down-convert the RF input and output signals to an intermediate frequency.

Optionally, in order to relax the requirements on the components in the feedback path of the second embodiment, the second embodiment may be modified to down-convert the RF input and output signals of the power amplifier 190. FIG. 9 illustrates an exemplary schematic block diagram of the transmitter in accordance with the second embodiment of the present invention implementing mixers to down-convert the RF input and output signals to an intermediate frequency. As illustrated, two mixers 430, 431 are placed between the power amplifier 190 and the envelope detectors 420, 421. A local oscillator 432 enables the mixers 430, 431 to down-convert the output and input signals of the power amplifier 190 from RF frequencies to a lower intermediate frequency. Although two additional mixers 430, 431 and one additional local oscillators 432 are required, the advantage of this approach is that components in the feedback path may operate at a lower frequency.

Figure 10:
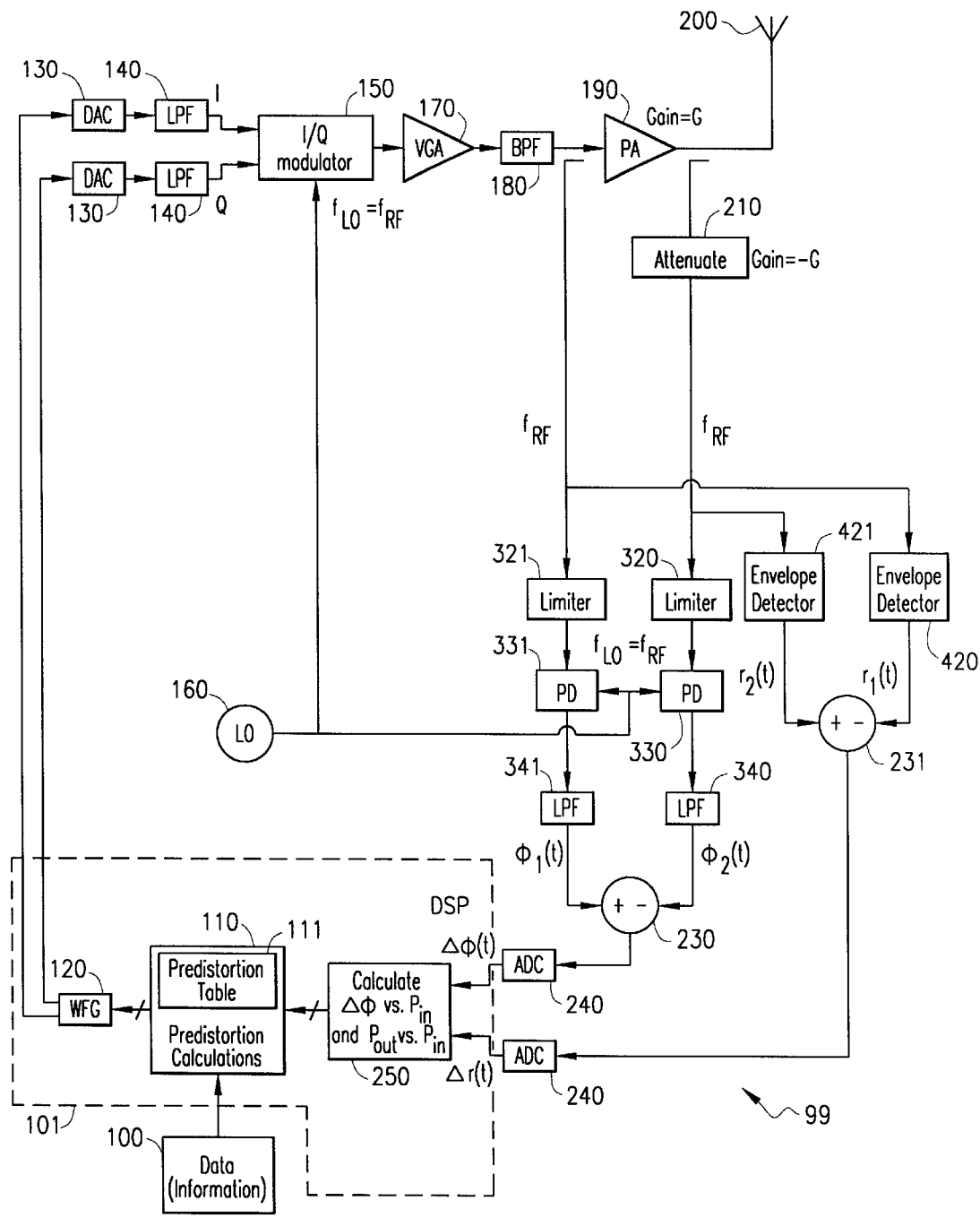
FIG. 10 illustrates an exemplary schematic block diagram of a transmitter in accordance with a third embodiment of the present invention.

FIG. 10 illustrates an exemplary schematic block diagram of a transmitter in accordance with a third embodiment of the present invention. The third embodiment utilizes the same forward transmission path as described in the embodiment of FIG. 2, but compensates for both phase and envelope (amplitude) distortion in the power amplifier 190 using different combinations of detectors in the feedback path. In the third embodiment, a part of the output signal and a part of the input signal of the power amplifier 190 are applied to two separate limiters 320, 321 and two separate envelope detectors 420, 421 after and before, respectively, amplification of the distortion detection signal. Preferably, the output of the power amplifier 190 is first attenuated by a factor approximating the nominal gain G of the power amplifier 190, enabling the inputs to the two limiters 320, 321 and two envelope detectors 420, 421 to have roughly the same amplitude level. A measurement of the phase and amplitude difference between the output of the power amplifier 190 and the input of the power amplifier 190 is detected by two corresponding error detectors 230, 231 and sent to analog-to-digital converters 240. In the digital domain, the relationships between the input power and (i) the measured envelope distortion and (ii) the measured phase distortion are calculated using the principles described above with respect to the embodiment of FIG. 2. These relationships are then used to update the predistortion lookup table 111 contained within the predistortion block 110, enabling the predistortion block 110 to adaptively compensate for both non-constant gain and non-constant phase-shift of the power amplifier 190.

Figure 11:
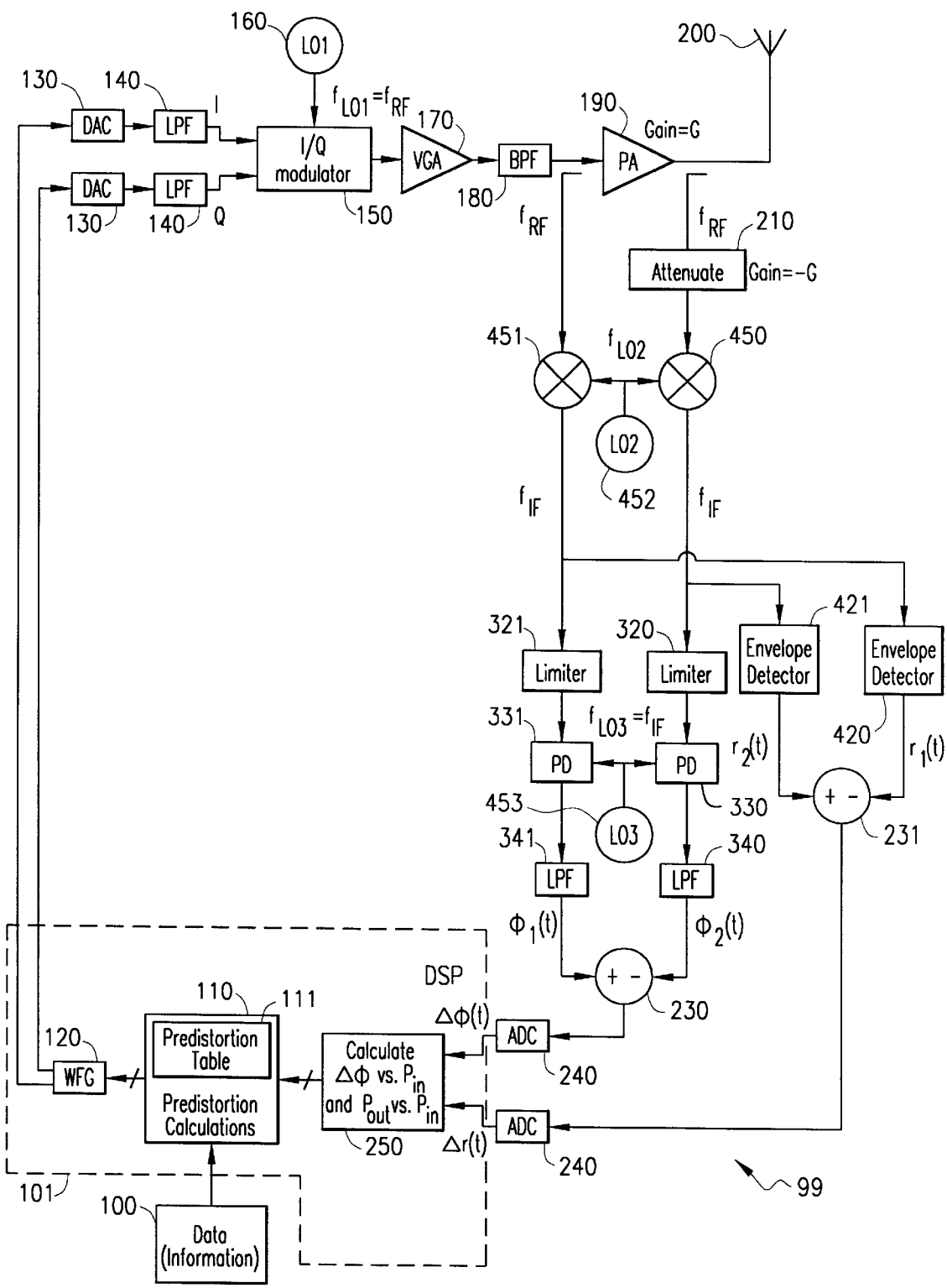
FIG. 11 illustrates an exemplary schematic block diagram of the transmitter in accordance with the third embodiment of the present invention implementing mixers to down-convert the RF input and output signals to an intermediate frequency.

Optionally, in order to relax the requirements on the components in the feedback path of the third embodiment, the third embodiment may be modified to down-convert the RF input and output signals of the power amplifier 190. FIG. 11 illustrates an exemplary schematic block diagram of the transmitter in accordance with the third embodiment of the present invention implementing mixers to down-convert the RF input and output signals to an intermediate frequency. As illustrated, two mixers 450, 451 are placed between the power amplifier 190 and both the limiters 320, 321 and the envelope detectors 420, 421. A first local oscillator 452 enables the mixers 450, 451 to down-convert the output and input signals of the power amplifier 190 from RF frequencies to a lower intermediate frequency. A second local oscillator 453 serves as the reference frequency for the phase detectors 330, 331. Although two additional mixers 450, 451 and two additional local oscillators 452, 453 are required, the advantage of this approach is that components in the feedback path may operate at a lower frequency.

Figure 12:
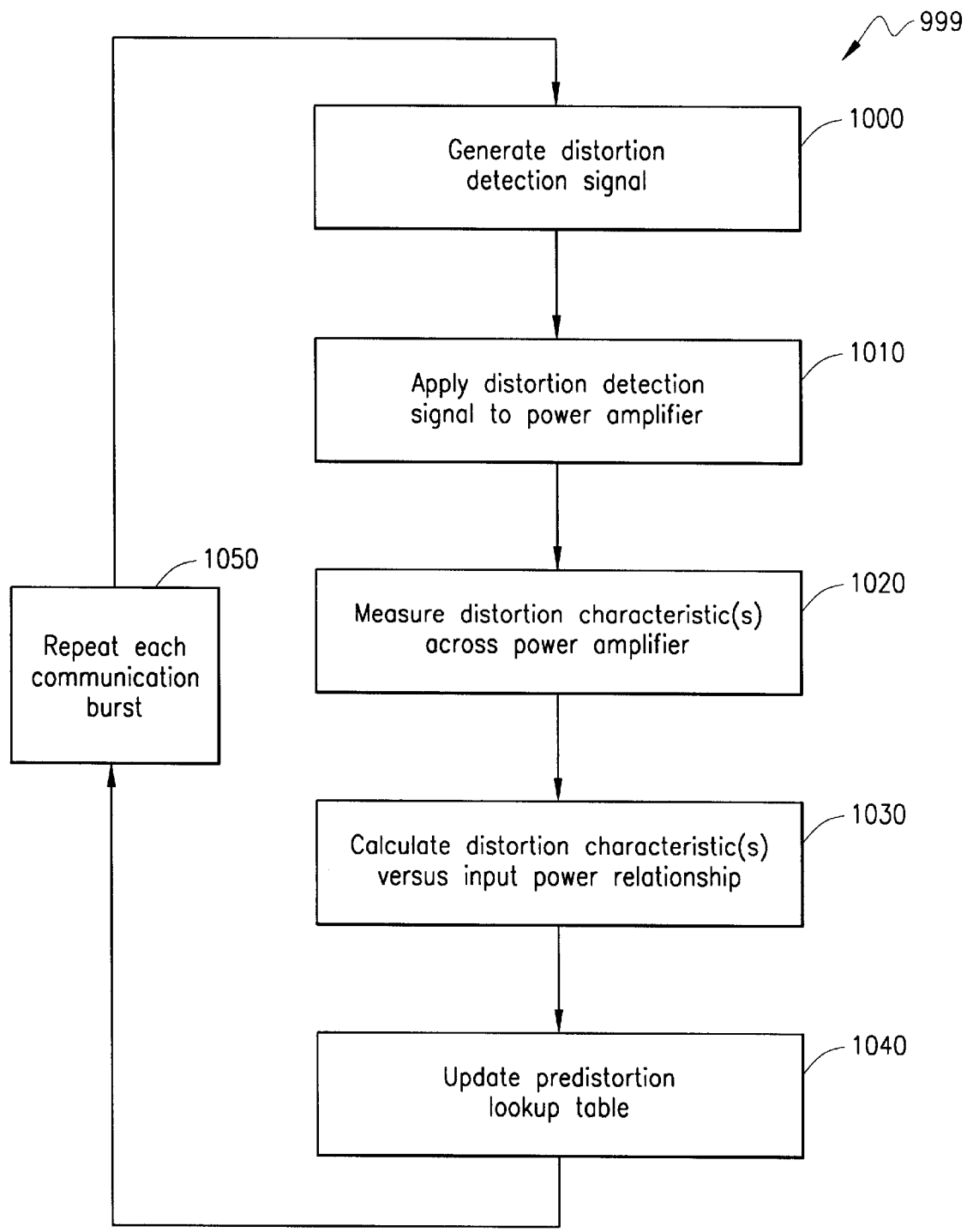
FIG. 12 illustrates an exemplary method in flow chart form by which an embodiment the present invention may be advantageously practiced.

Referring to FIG. 12, an exemplary method in flow chart form by which the present invention may be advantageously practiced is illustrated generally at 999. As shown, a distortion detection signal, such as a ramp-up signal, ramp-down signal, or preferably a burst ramp-up signal or burst ramp-down signal, is generated at step 1000. At step 1010, the generated distortion detection signal is applied to a power amplifier 190, and distortion characteristic(s) across the power amplifier 190 is (are) measured at step 1020 during application of the distortion detection signal to the power amplifier 190. Based on the measured distortion characteristic(s) and characteristics of the distortion detection signal, a relationship between the distortion detection signal and input power is calculated at step 1030 using the principles described above with respect to the embodiment of, for example, FIG. 2. This calculated relationship is then utilized to update predistortion coefficients stored in a predistortion lookup table 111 at step 1040. These updated coefficients are then applied to input data to predistort digital information 100 in such a manner that a linear input-output relationship is maintained at the output of the power amplifier 190.

Optionally, steps 1000–1040 are repeated for each communication burst (e.g., as indicated at step 1050). In one advantageous aspect of the preferred embodiment of the present invention, the predistortion lookup table 111 is updated only once per communication burst. This aspect of the preferred embodiment relaxes the processing requirements of the digital signal processor depicted generally at 101 (along with other associated functional or memory elements) or other device which updates the predistortion lookup table 111. Furthermore, if a burst up-ramp signal is used as the distortion detection signal, the updated predistortion coefficients can be applied on the same communication burst, assuming the predistortion lookup table 111 can be updated fast enough. Alternatively, if the power amplifier 190 characteristics do not vary much between bursts, the distortion characteristics can be measured at one burst and applied at a later or subsequent burst. Another alternative is to determine the distortion characteristics based on measurements from several distortion detection signals (e.g, after determining some kind of average). Finally, in another aspect of the embodiment of FIG. 2, the distortion characteristics of the power amplifier 190 are only measured over the dynamic range that is used in the modulated signal. For example, only a part of the distortion detection signal may be needed. Consequently, the distortion characteristics of the power amplifier 190 only have to be measured for those input power levels that will be used when the power amplifier is modulated.

Although preferred embodiments of the method and apparatus of the present invention have been illustrated in the accompanying Drawings and described in the foregoing Detailed Description, it will be understood that the present invention is not limited to the embodiments disclosed, but is capable of numerous rearrangements, modifications, and substitutions without departing from the spirit and scope of the present invention as set forth and defined by the following claims.

What is claimed is:

1. A method for adaptively compensating for a distortion characteristic of a power amplifier, the method comprising the steps of:

measuring the distortion characteristic across the power amplifier during amplification of a distortion detection signal, the distortion detection signal having a defined input power characteristic;

calculating a relationship between the measured distortion characteristic and input power;

updating a predistortion lookup table in accordance with the calculated relationship; and wherein the step of measuring is performed using a pair of detectors, a first detector of the pair of detectors connected to an input terminal of the power amplifier, and a second detector of the pair of detectors connected to an output terminal of the power amplifier.

2. The method for adaptively compensating for a distortion characteristic of a power amplifier as in claim 1, wherein the distortion characteristic comprises phase distortion.

3. The method for adaptively compensating for a distortion characteristic of a power amplifier as in claim 1, wherein the distortion characteristic comprises envelope distortion.

4. The method for adaptively compensating for a distortion characteristic of a power amplifier as in claim 1, wherein the distortion detection signal comprises at least one of an up-ramp signal and a down-ramp signal.

5. The method for adaptively compensating for a distortion characteristic of a power amplifier as in claim 1, wherein the distortion detection signal comprises at least one of a burst up-ramp signal and a burst down-ramp signal.

6. The method for adaptively compensating for a distortion characteristic of a power amplifier as in claim 1, wherein the method is performed only once per communication burst.

7. The method for adaptively compensating for a distortion characteristic of a power amplifier as in claim 1, wherein the method is performed during only a portion of a communication burst.

8. The method for adaptively compensating for a distortion characteristic of a power amplifier as in claim 1, further comprising the step of applying the updated predistortion lookup table to an input data stream.

9. The method for adaptively compensating for a distortion characteristic of a power amplifier as in claim 8, wherein the step of updating and the step of applying are performed in a same communication burst.

10. The method for adaptively compensating for a distortion characteristic of a power amplifier as in claim 8, wherein the step of measuring is performed in a first communication burst, and the step of applying is performed in a subsequent communication burst.

11. The method for adaptively compensating for a distortion characteristic of a power amplifier as in claim 1, wherein the step of calculating the relationship is performed, at least in part, using a mean distortion characteristic measured from two or more communication bursts.

12. The method for adaptively compensating for a distortion characteristic of a power amplifier as in claim 1, further comprising the step of attenuating an output signal at the output terminal of the power amplifier by approximately a nominal gain of the power amplifier.

13. The method for adaptively compensating for a distortion characteristic of a power amplifier as in claim 1, where in the step of measuring is performed only for input power levels that will be used by an input signal.

14. The method for adaptively compensating for a distortion characteristic of a power amplifier as in claim 1, wherein the method is performed in at least one of a mobile station, a base station and a data terminal.

15. An apparatus for linearizing a power amplifier, the apparatus comprising:

at least one detector adapted to measure a distortion characteristic across a power amplifier during amplification of a distortion detection signal, the distortion detection signal having a known input power characteristic;

a processor coupled to the at least one detector, the processor adapted to calculate a relationship between the measured distortion characteristic and input power of the power amplifier;

a predistortion lookup table storing predistortion coefficients, the processor being adapted to update the predistortion coefficients in accordance with the calculated relationship to adaptively compensate for the measured distortion characteristic; and wherein the at least one detector comprises a pair of detectors, a first detector of the pair of detectors connected to an output of the power amplifier, and a second detector of the pair of detectors connected to an input of the power amplifier.

16. The apparatus for linearizing a power amplifier as in claim 15, wherein the distortion characteristic comprises phase distortion.

17. The apparatus for linearizing a power amplifier as in claim 15, wherein the distortion characteristic comprises amplitude distortion.

18. The apparatus for linearizing a power amplifier as in claim 15, wherein the distortion characteristic comprises phase distortion and amplitude distortion.

19. The apparatus for linearizing a power amplifier as in claim 15, wherein the distortion detection signal comprises at least one of an up-ramp signal and a down-ramp signal.

20. The apparatus for linearizing a power amplifier as in claim 15, wherein the distortion detection signal comprises at least one of a burst up-ramp signal and a burst down-ramp signal.

21. The apparatus for linearizing a power amplifier as in claim 15, wherein the processor updates the predistortion coefficients only once per communication burst.

22. The apparatus for linearizing a power amplifier as in claim 15, wherein the processor calculates the relationship between the measured distortion characteristic and input power based, at least in part, on a mean distortion characteristic measured from two or more communication bursts.

23. The apparatus for linearizing a power amplifier as in claim 15, wherein the at least one detector measures the distortion characteristic during only a portion of a communication burst.

24. The apparatus for linearizing a power amplifier as in claim 15, further comprising a predistortion unit that predistorts an input data stream in accordance with the predistortion coefficients.

25. The apparatus for linearizing a power amplifier as in claim 24, wherein the processor updates the predistortion coefficients in a first communication burst and the predistortion unit predistorts the input data stream using the updated predistortion coefficients in the first communication burst.

26. The apparatus for linearizing a power amplifier as in claim 24, wherein the at least one detector measures the distortion characteristic in a first communication burst and the predistortion unit predistorts the input data stream using the updated predistortion coefficients in a subsequent communication burst.

27. An apparatus for linearizing a power amplifier, the apparatus comprising:

at least one detector adapted to measure a distortion characteristic across a power amplifier during amplification of a distortion detection signal, the distortion detection signal having a known input power characteristic;

a processor coupled to the at least one detector, the processor adapted to calculate a relationship between the measured distortion characteristic and input power;

a predistortion lookup table storing predistortion coefficients, the processor being adapted to update the redistortion coefficients in accordance with the calculated relationship to adaptively compensate for the measured distortion characteristic; and wherein the at least one detector comprises a pair of phase detectors, a first phase detector of the pair of phase detectors connected to an output of the power amplifier, and a second phase detector of the pair of detectors connected to an input of the power amplifier.

28. The apparatus for linearizing a power amplifier as in claim 27, wherein the output of the power amplifier is attenuated by approximately a nominal gain of the power amplifier before being applied to the first phase detector.

29. The apparatus for linearizing a power amplifier as in claim 27, further comprising a pair of mixers adapted to down-convert an input signal from an RF frequency to an intermediate frequency, a first mixer of the pair of mixers deposed between the output of the power amplifier and the first phase detector, and a second mixer of the pair of mixers deposed between the input of the power amplifier and the second phase detector.

30. An apparatus for linearizing a power amplifier, the apparatus comprising:

at least one detector adapted to measure a distortion characteristic across a power amplifier during amplification of a distortion detection signal, the distortion detection signal having a known input power characteristic;

a processor coupled to the at least one detector, the processor adapted to calculate a relationship between the measured distortion characteristic and input power;

a predistortion lookup table storing predistortion coefficients, the processor being adapted to update the predistortion coefficients in accordance with the calculated relationship to adaptively compensate for the measured distortion characteristic; and wherein the at least one detector comprises a pair of envelope detectors, a first envelope detector of the pair of envelope detectors connected to an output of the power amplifier, and a second envelope detector of the pair of envelope detectors connected to an input of the power amplifier.

31. The apparatus for linearizing a power amplifier as in claim 30, wherein the output of the power amplifier is attenuated by approximately a nominal gain of the power amplifier before being applied to the first envelope detector.

32. The apparatus for linearizing a power amplifier as in claim 30, further comprising a pair of mixers adapted to down-convert an input signal from an RF frequency to an intermediate frequency, a first mixer of the pair of mixers deposed between the output of the power amplifier and the first envelope detector, and a second mixer of the pair of mixers deposed between the input of the power amplifier and the second envelope detector.

33. The apparatus for linearizing a power amplifier as in claim 15, wherein the apparatus is used in at least one of a mobile station, a base station and a data terminal.

* * * * *

UNITED STATES PATENT AND TRADEMARK OFFICE
CERTIFICATE OF CORRECTION

PATENT NO. : 6,246,286 B1
DATED : June 12, 2001
INVENTOR(S) : Jonas Persson

It is certified that error appears in the above-identified patent and that said Letters Patent is hereby corrected as shown below:

Column 3,
Line 33, replace "phaseshift" with -- phase-shift --

Column 11,
Lines 28-29, replace "up dated" with -- updated --

Column 12,
Line 60, replace "where in" with -- wherein --

Column 14,
Line 9, replace "redistortion" with -- predistortion --

Signed and Sealed this

Twenty-ninth Day of October, 2002

*Attest:*

*Attesting Officer*

JAMES E. ROGAN
*Director of the United States Patent and Trademark Office*